(12) United States Patent
Kim et al.

(10) Patent No.: US 9,099,677 B2
(45) Date of Patent: Aug. 4, 2015

(54) ENCAPSULATION STRUCTURE FOR AN ORGANIC LIGHT EMITTING DISPLAY DEVICE, AN ORGANIC LIGHT EMITTING DISPLAY DEVICE, AND METHODS OF MANUFACTURING AN ORGANIC LIGHT EMITTING DISPLAY DEVICE

(71) Applicant: SAMSUNG DISPLAY CO., LTD., Yongin, Gyeonggi-Do (KR)

(72) Inventors: Hun Kim, Seoul (KR); Ou-Hyen Kim, Suwon-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/325,427

(22) Filed: Jul. 8, 2014

(65) Prior Publication Data

US 2015/0028306 A1    Jan. 29, 2015

(30) Foreign Application Priority Data

Jul. 23, 2013 (KR) .................. 10-2013-0086389

(51) Int. Cl.
*H01L 51/52* (2006.01)
*H01L 27/32* (2006.01)

(52) U.S. Cl.
CPC ........ *H01L 51/5253* (2013.01); *H01L 27/3241* (2013.01); *H01L 51/5259* (2013.01)

(58) Field of Classification Search
CPC .................. H01L 51/5253; H01L 51/5256
USPC ........................................... 257/40
See application file for complete search history.

(56) References Cited

U.S. PATENT DOCUMENTS

| 8,115,326 B2 | 2/2012 | Aitken et al. |
| 2008/0305360 A1 | 12/2008 | Han et al. |
| 2013/0181602 A1* | 7/2013 | Kang et al. ............. 313/504 |
| 2014/0145152 A1* | 5/2014 | Chung et al. ............. 257/40 |

FOREIGN PATENT DOCUMENTS

| KR | 10-2008-0107220 A | 12/2008 |
| KR | 10-2010-0029350 A | 3/2010 |
| KR | 10-2010-0124017 A | 11/2010 |

* cited by examiner

*Primary Examiner* — Daniel Shook
(74) *Attorney, Agent, or Firm* — Lee & Morse, P.C.

(57) ABSTRACT

An encapsulation structure for an organic light emitting display device, an organic light emitting display device, and a method of manufacturing an organic light emitting display device are provided. The encapsulation structure includes a first porous layer, a first planarization layer, and a first barrier layer. The first porous layer above a substrate may have a curved top surface. The first planarization layer on the first porous layer may have a flat top surface. The first barrier layer on the first planarization layer may include a low melting point glass.

21 Claims, 11 Drawing Sheets

ENCAPSULATION STRUCTURE FOR AN ORGANIC LIGHT EMITTING DISPLAY DEVICE, AN ORGANIC LIGHT EMITTING DISPLAY DEVICE, AND METHODS OF MANUFACTURING AN ORGANIC LIGHT EMITTING DISPLAY DEVICE

CROSS-REFERENCE TO RELATED APPLICATION

Korean Patent Application No. 10-2013-0086389, filed on Jul. 23, 2013, in the Korean Intellectual Property Office, and entitled: "Encapsulation Structure For An Organic Light Emitting Display Device, Organic Light Emitting Display Device and Methods Of Manufacturing An Organic Light Emitting Display Device" is incorporated by reference herein in its entirety.

BACKGROUND

1. Field

Example embodiments relate to an encapsulation structure for an organic light emitting display device, an organic light emitting display device, and a method of manufacturing an organic light emitting display device.

2. Description of the Related Art

An organic light emitting display (OLED) device may display information such as images and characters using light generated from an organic layer therein. As for the organic light emitting display device, light may be generated by a combination of holes from an anode and electrons from a cathode occurring at the organic layer between the anode and the cathode. In various display devices such as a liquid crystal display (LCD) device, a plasma display (PDP) device, and a field emission display (FED) device, the organic light emitting display device may have several advantages such as wide viewing angle, high response time, thin thickness, and low power consumption, such that the organic light emitting display may be widely employed in various electrical and electronic apparatuses.

SUMMARY

Embodiments are directed to an encapsulation structure for an organic light emitting display device, an organic light emitting display device, and methods of manufacturing the same. According to present disclosure, there is provided an encapsulation structure including a first porous layer, a first planarization layer, and a first barrier layer. The first porous layer above a substrate has a curved top surface. The first planarization layer on the first porous layer has a flat top surface. The first barrier layer on the first planarization layer includes a low melting point glass.

The first low melting point glass may include a tin-phosphate glass, a tin-borophosphate glass, a tin-fluorophosphate glass, a tungsten-doped tin-fluorophosphate glass, a chalcogenide glass, a telluride glass, a borate glass or a phosphate glass. The first low melting point glass may include the tin-phosphate glass, the tin-borophosphate glass or the tin-fluorophosphate glass, and the first low melting point glass may include tin ions ($Sn^{2+}$).

The encapsulation structure may further include a second barrier layer disposed on the first barrier layer. The second barrier layer may include a second low melting point glass containing a tin-phosphate glass, a tin-borophosphate glass, or a tin-fluorophosphate glass. The second low melting point glass may include oxidized tin ions ($Sn^{4+}$). The first low melting point glass may have a melting point below about 400° C.

The first porous layer may include lithium fluoride ($LiF_x$) or tungsten oxide ($WO_x$). The first porous layer may have a thickness of about 50 nm to about 100 nm. The first porous layer may include a plurality of pores, and the plurality of pores may receive a residual moisture or a residual solvent from the first planarization layer.

The encapsulation structure may further include a second porous layer disposed between the first porous layer and the first planarization layer. The second porous layer may include aluminum oxide ($AlO_x$), lithium fluoride ($LiF_x$) or tungsten oxide ($WO_x$). The encapsulation structure may further include a second barrier layer disposed between the first planarization layer and the first barrier layer, and a second planarization layer disposed between the second barrier layer and the first barrier layer. The first planarization layer may include an acryl resin or a liquid silicon.

According to present disclosure, there is provided an organic light emitting display device including an organic light emitting structure disposed on a substrate and an encapsulation structure capping the organic light emitting structure. The encapsulation structure may include a first porous layer having a curved top surface on the organic light emitting structure, a first planarization layer having a flat top surface on the first porous layer, and a first barrier layer including a low melting point glass on the first planarization layer. The low melting point glass may include a tin-phosphate glass, a tin-borophosphate glass, a tin-fluorophosphate glass, a tungsten-doped tin-fluorophosphate glass, a chalcogenide glass, a telluride glass, a borate glass, or a phosphate glass.

The first porous layer may include lithium fluoride (LiFx) or tungsten oxide ($WO_x$). The first porous layer may include a plurality of pores, and the plurality of pores may receive a residual moisture or a residual solvent occurred from the first planarization layer. The organic light emitting display device may further include a second porous layer disposed between the first porous layer and the first planarization layer. The organic light emitting display device may further includes a second barrier layer disposed between the first planarization layer and the first barrier layer, and a second planarization layer disposed between the second barrier layer and the first barrier layer.

According to present disclosure, there is provided a method of manufacturing an organic light emitting display device. In the method, an organic light emitting structure is formed on a substrate. A porous layer is formed to cover the organic light emitting structure. A planarization layer is formed on the porous layer. The planarization layer can have a flat top surface. A barrier layer is formed on the planarization layer using a low melting point glass. Forming the porous layer may include performing an evaporation process using lithium fluoride ($LiF_x$) or tungsten oxide ($WO_x$). Forming the barrier layer may include performing a sputtering process using the low melting point glass.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
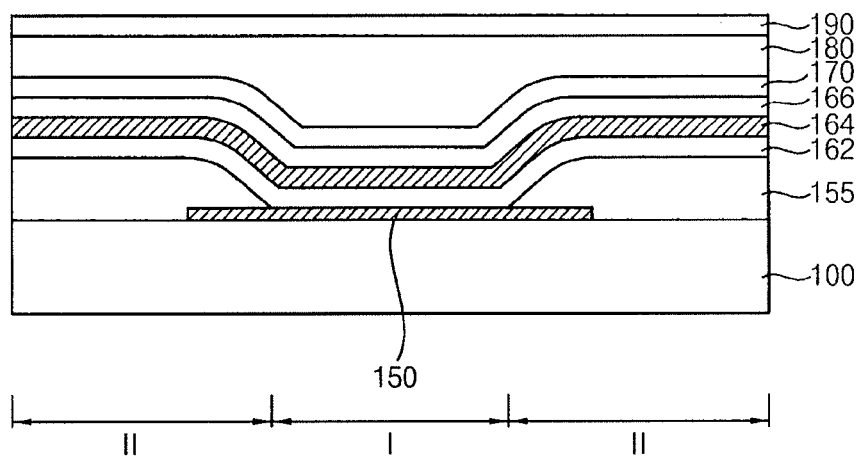
FIG. 1 illustrates a cross-sectional view of an organic light emitting structure and an encapsulation structure in accordance with some embodiments.

Example embodiments will now be described more fully hereinafter with reference to the accompanying drawings; however, they may be embodied in different forms and should not be construed as limited to the embodiments set forth herein. In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, third, and the like may be used herein to describe various elements, these elements should not be limited by these terms. These terms are used to distinguish one element from another. Thus, a first element discussed below could be termed a second element without departing from the present teachings. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," and the like.).

The terminology used herein is for the purpose of describing particular example embodiments only and is not intended to be limiting of the present teachings. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components in one or more embodiments, but do not preclude the presence or addition of one or more other features, integers, steps, operations, elements, components, and/or groups thereof in one or more embodiments.

Unless otherwise defined, all terms (including technical and scientific terms) used herein have the same meaning as commonly understood by one of ordinary skill in the art to which the present teachings belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a cross-sectional view of an organic light emitting structure and an encapsulation structure in accordance with some embodiments. The organic light emitting structure may include a first electrode 150, a pixel defining layer 155, an organic layer 162 and a second electrode 164 on a substrate 100, and the encapsulation structure may include a capping layer 166, a first porous layer 170, a first planarization layer 180 and a first barrier layer 190.

The substrate 100 may include a transparent insulating substrate. For example, the substrate 100 may include a glass substrate, a quartz substrate, a transparent resin substrate, or the like. In other implementations, the substrate 100 may include a flexible substrate. In an example embodiment, the substrate 100 may be divided into a pixel region I for emitting light, and a peripheral region II surrounding the pixel region I. The first electrode 150 may be disposed in the pixel region I on the substrate 100. The first electrode 150 may serve as a pixel electrode that may be patterned to correspond to each pixel. Further, the first electrode 150 may be an anode for supplying holes into the organic layer 162.

When, for example, the organic light emitting structure is a top emission type, the first electrode 150 may serve as a reflective electrode having a reflectivity. Therefore, the first electrode 150 may include a metal and/or an alloy having a relatively high reflectivity. For example, the first electrode 150 may include silver (Ag), aluminum (Al), platinum (Pt), gold (Au), chromium (Cr), tungsten (W), molybdenum (Mo), titanium (Ti), palladium (Pa), an alloy thereof, or the like, or a combination thereof. These may be used alone or in a combination thereof.

The pixel defining layer 155 may be disposed in the peripheral region II on the substrate 100. The pixel defining layer 155 on the substrate 100 may cover a portion of the first electrode 150. The pixel defining layer 155 may separate each of the first electrodes 150, and may prevent a concentration of a current at an end portion (that is, an edge) of the first electrode 150. The pixel defining layer 155 may have a top surface substantially higher than a top surface of the first electrode 150. The pixel defining layer 155 may have a sidewall that may have an acute angle with respect to the top surface of the first electrode 150. A stepped portion may be formed due to a height difference between the first electrode 150 and the pixel defining layer 155.

The organic layer 162 may be disposed on the first electrode 150. The organic layer 162 may include at least one light emitting layer. In example embodiments, the organic layer 162 may include a blue light emitting layer, a green light emitting layer, or a red light emitting layer. In other example embodiments, the organic layer 162 may include a blue light emitting layer, a green light emitting layer, and a red light emitting layer that may be sequentially stacked to emit a white light. Further, the organic layer 162 may selectively include a hole transfer layer, a hole injection layer, an electron injection layer, or an electrode transfer layer.

The organic layer 162 may be disposed on the top surface of the first electrode 150 and the top surface and the sidewall of the pixel defining layer 155. In other example embodiments, the organic layer 162 may be disposed on the top surface of the first electrode 150 and the sidewall of the pixel defining layer 155, such that each of the organic layers 162 may be separated according to the pixel. In another example embodiment, the hole transfer layer, the hole injection layer, and the light emitting layer of the organic layer 162 may be disposed on the top surface of the first electrode 150 and the sidewall of the pixel defining layer 155, and the electrode transfer layer and the electrode injection layer of the organic layer 162 may be disposed on the top surface of the first electrode 150 and the top surface and the sidewall of the pixel defining layer 155.

The organic layer 162 may have a substantially uniform thickness. The top surface of the first electrode 150 and the top surface and the sidewall of the pixel defining layer 155 may form a curved surface, such that the organic layer 162 may have a curved top surface according to profiles of the first electrode 150 and the pixel defining layer 155.

The second electrode 164 may be disposed on the organic layer 162. When, for example, the first electrode 150 serves as the pixel electrode, the second electrode 164 may serve as a common electrode that may entirely cover the organic layer 162. Further, when, for example, the first electrode 150 is the anode, the second electrode 164 may be a cathode for supplying electrons into the organic layer 162. When, for example, the organic light emitting structure has the top emission type, the second electrode 164 may serve as a transparent electrode having a transmittance or a transflective electrode having a semi-transmittance. Therefore, the second electrode 164 may include a transparent metal oxide, a metal or an alloy.

When, for example, the second electrode 164 serves as the transflective electrode, the second electrode 164 may have a predetermined reflectivity and a predetermined transmittance. If the second electrode 164 has a relatively large thickness, a light efficiency of the organic light emitting structure may degrade, such that the second electrode 164 may have a relatively small thickness. For example, the second electrode 164 may have a thickness less than about 20 nm. For example, the second electrode 164 may have a thickness of about 10 nm to about 17 nm.

The second electrode 164 may include a metal and/or an alloy such as silver (Ag), aluminum (Al), platinum (Pt), gold (Au), chromium (Cr), tungsten (W), molybdenum (Mo), titanium (Ti), palladium (Pa), alloys of these metals, or the like, or a combination thereof. For example, the second electrode 164 may include Mg—Ag alloy with an Ag concentration of about 10 wt. %. The second electrode 164 may have a substantially uniform thickness. The organic layer 162 may have the curved top surface, such that the second electrode 164 also may have a curved top surface according to a profile of the organic layer 162.

The capping layer 166 may be disposed on the second electrode 164. For example, the capping layer 166 may include a transparent material having a refractive index above about 1.75. As the refractive index of the capping layer 166 increases, the light emitted from the organic layer 162 may travel in a direction substantially perpendicular to the top surface of the substrate 100. As the refractive index of the capping layer 166 increases, the light passing through the capping layer 166 may be refracted in the direction substantially perpendicular to the top surface of the substrate 100 according to Snell's law. For example, the capping layer 166 may include silicon nitride, silicon oxynitride or Alq3 (tris(8-oxoquinoline)aluminum(III)). In an example embodiment, the capping layer 166 may include an insulation material for isolating the second electrode 164. The capping layer 166 may have a substantially uniform thickness. The second electrode 164 may have the curved top surface, such that the capping layer 166 also may have a curved top surface according to a profile of the second electrode 164.

The first porous layer 170 may be disposed on the capping layer 166. The first porous layer 170 may include a plurality of pores, and may have a relatively large surface roughness. In example embodiments, the first porous layer 170 may include lithium fluoride ($LiF_x$) or tungsten oxide ($WO_x$). The first porous layer 170 may have a thickness of about 50 nm to about 100 nm. As the thickness of the first porous layer 170 increases above about 100 nm, a density of the first porous layer 170 may increase, and the number of pores and the surface roughness of the first porous layer 170 may decrease. If the first porous layer 170 were to have a thickness above about 100 nm, the first porous layer 170 might not have enough surface roughness. Further, if the first porous layer 170 were to have a thickness below about 50 nm, the first porous layer 170 might not include enough pores for receiving residual moisture or a residual solvent from the first planarization layer 180 as described herein.

The first porous layer 170 may be formed by an evaporation process or a sputtering process. When, for example, the first porous layer 170 is formed by the evaporation process, the first porous layer 170 may include the relatively large number of pores compared with other porous layer formed by another process. The function of the first porous layer 170 is described herein. The porous layer 170 may have a substantially uniform thickness. The capping layer 166 may have the curved top surface, such that the porous layer 170 also may have a curved top surface according to a profile of the capping layer 166.

The first planarization layer 180 may be disposed on the first porous layer 170. The first planarization layer 180 may have a substantially flat top surface. The first planarization layer 180 may include various organic materials. For example, the first planarization layer 180 may include various resins such as an acryl resin, a liquid silicon, or a silicon filler. The first planarization layer 180 may be formed by preparing a coating solution using the acryl resin and a solvent, by coating on the first planarization layer 170 using the coating solution, and by performing a thermal hardening process or a ultra-violet (UV) hardening process. Then, a heat treatment process or an outgassing process may be performed to remove moisture or a solvent in the first planarization layer 180. Even though, the heat treatment process or the outgassing process may be performed for a relatively long time, a moisture or a solvent may inevitably remain in the first planarization layer 180.

After forming the encapsulation structure, the residual moisture or the residual solvent may be distributed in the first porous layer 170. The residual moisture or the residual solvent may be received in the plurality of pores of the first porous layer 170 and may be received at an interface between the top surface of the first porous layer 170 and the bottom surface of the first planarization layer 180. The residual moisture or the residual solvent may be prevented from contaminating or degrading the organic light emitting structure, such that a dark spot or a pixel shrinkage may be prevented. Further, when, for example, the first porous layer 170 includes lithium fluoride, the lithium fluoride may effectively absorb the residual moisture. The lithium fluoride of the first porous layer 170 may react with the residual moisture, such that the first porous layer 170 may have an improved moisture absorption characteristic. If the first porous layer 170 is not disposed, the residual moisture or the residual solvent might not be distributed. For example, if the residual moisture or the residual solvent is concentrated at a certain defective point, the residual moisture or the residual solvent may contaminate or degrade the organic light emitting structure.

The first barrier layer 190 may be disposed on the first planarization layer 180. The first barrier layer 190 may encapsulate the organic light emitting structure between the substrate 100 and the first barrier layer 190. The first barrier layer 190 may prevent external moisture or external contaminants from infiltrating into the organic light emitting structure, thereby degrading the organic light emitting structure. The first barrier layer 190 may include a low melting point glass. In example embodiments, the low melting point glass may include a tin-phosphate glass, a tin-borophosphate glass, a tin-fluorophosphate glass, a tungsten-doped tin-fluorophosphate glass, a chalcogenide glass, a telluride glass, a borate glass, or a phosphate glass.

The low melting point glass may include the tin-phosphate glass. The tin phosphate glass may be formed by mixing tin oxide (SnO) and phosphorus oxide ($P_2O_5$). For example, the tin phosphate glass may include about 5 to 90 mol % $P_2O_5$ and about 10 to 95 mol % SnO. The tin phosphate glass may include tin ions ($Sn^{2+}$). The low melting point glass may include tin-fluorophosphate glass. The tin-fluorophosphate glass may be formed by mixing tin fluoride ($SnF_2$), tin oxide (SnO) and phosphorus oxide ($P_2O_5$). For example, the tin-fluorophosphate glass may include tin ions ($Sn^{2+}$). The low melting point glass may include the tin-borophosphate glass. The tin-borophosphate glass may be formed by mixing tin oxide (SnO) and boron phosphate ($BPO_4$). For example, the tin-borophosphate glass may include tin ions ($Sn^{2+}$). The low melting point glass may have, for example, a melting point below about 1000° C., a melting point below about 600° C., or a melting point below about 400° C.

The first barrier layer 190 may be formed by a process for forming a layer and a process for removing defects of the layer. The process for removing the defects may include a heat treatment process. The first barrier layer 190 may have an improved encapsulation characteristic due to the heat treatment process. The heat treatment process may be performed at a temperature between about 100° C. and about 150° C. The first barrier layer 190 may have a relatively low melting point, such that the heat treatment process may partially sinter the first barrier layer 190, thereby removing the defects of the first barrier layer 190. The temperature of the heat treatment process is relatively low, such that the heat treatment process need not damage the organic light emitting structure or the substrate 100.

Further, the first planarization layer 180 may have the flat top surface, such that the first barrier layer 190 coated on the first planarization layer 180 may be formed stably. Therefore, the first barrier layer 190 on the first planarization layer 180 may have a uniform thickness and a relatively high density. Further, the first planarization layer 180 may cover particles or contaminants that may inevitably occur during the manufacturing process, such that the first barrier layer 190 need not have defects resulting from the inevitable particles or contaminants. Therefore, the first barrier layer 190 disposed on the first planarization layer 180 may have an improved reliability.

If the first barrier layer 190 were to be directly formed on the first porous layer 170 or the capping layer 166 without the first planarization layer 180, the first barrier layer 190 could have an irregular thickness and a low density on the curved top surface of the first porous layer 170. Further, particles or contaminants that may inevitably occur during the process for forming the first porous layer 170 could be concentrated at a specific point of the curved top surface of the first porous layer 170, thereby forming defects of the first barrier layer 190.

According to example embodiments, the encapsulation structure may include the first porous layer 170, the first planarization layer 180, and the first barrier layer 190. The first planarization layer 180 may have the flat top surface, such that the first barrier layer 190 disposed on the first planarization layer 180 may have the uniform thickness and the relatively high density, thereby having the improved encapsulation characteristic. The first porous layer 170 may receive the residual moisture or the residual solvent occurred from the first planarization layer 180. Therefore, the residual moisture or the residual solvent need not be concentrated at a specific point, such that the dark spot or the pixel shrinkage may be prevented. Further, the first barrier layer 190 may include the low melting point glass, such that the low temperature heat treatment process may remove the defects of the first barrier layer 190. Accordingly, the first barrier layer 190 may have the improved reliability.

Figure 2:
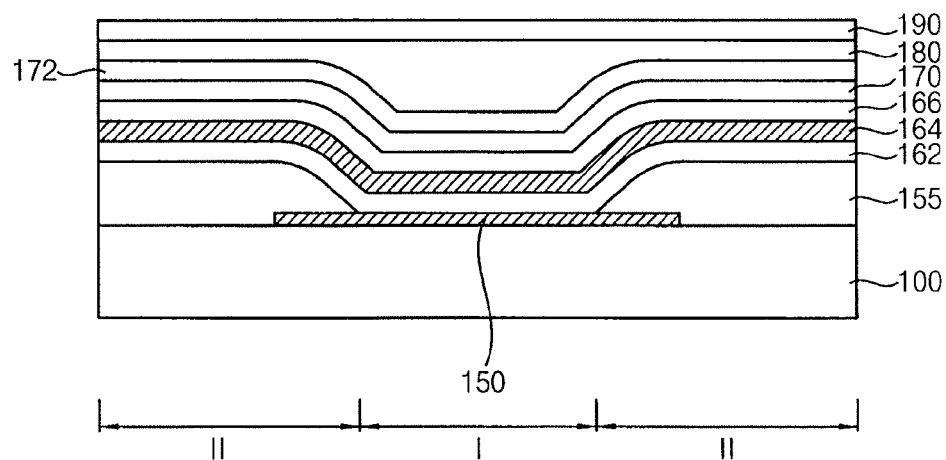
FIG. 2 illustrates a cross-sectional view of an organic light emitting structure and an encapsulation structure in accordance with other embodiments.

FIG. 2 illustrates a cross-sectional view of an organic light emitting structure and an encapsulation structure in accordance with other embodiments. Referring to FIG. 2, the organic light emitting structure may include a first electrode 150, a pixel defining layer 155, an organic layer 162, and a second electrode 164 on a substrate 100, and the encapsulation structure may include a capping layer 166, a first porous layer 170, a second porous layer 172, a first planarization layer 180, and a first barrier layer 190. The substrate 100 may include a glass substrate, a quartz substrate, a transparent resin substrate, or the like. In other implementations, the substrate 100 may include a flexible substrate. The organic light emitting structure may be disposed on the substrate 100. The first electrode 150, the pixel defining layer 155, the organic layer 162, and the second electrode 164 of FIG. 2 may be substantially the same as or similar to those illustrated in FIG. 1.

The capping layer 166 may be on the second electrode 164. The capping layer 166 may include a transparent material having a refractive index above about 1.75. The capping layer 166 may include silicon nitride, silicon oxynitride, or Alq3. The first porous layer 170 may be disposed on the capping layer 166. The first porous layer 170 may include a plurality of pores, and may have a relatively large surface roughness. The first porous layer 170 may include lithium fluoride ($LiF_x$) or tungsten oxide ($WO_x$). The second porous layer 172 may be on the first porous layer 170. The second porous layer 172 may include a plurality of pores, and may have a relatively large surface roughness.

The second porous layer 172 may include a material different from that of the first porous layer 170. For example, the second porous layer 172 may include aluminum oxide ($Al_2O_3$) or tungsten oxide ($WO_x$), when the first porous layer 170 includes lithium fluoride ($LiF_x$). For example, the second porous layer 172 may include aluminum oxide ($Al_2O_3$) or lithium fluoride ($LiF_x$), when the first porous layer 170 includes tungsten oxide ($WO_x$). For example, the second porous layer 172 may be formed by a sputtering process using aluminum oxide ($Al_2O_3$). A top surface of the first porous layer 170 may include the plurality of pores and may have relatively large surface roughness, such that the aluminum oxide formed on the top surface of the first porous layer 170 may also include the plurality of pores. In example embodiments, the second porous layer 172 may have a thickness of about 50 nm to about 100 nm.

As described with reference to FIG. 1, if the first porous layer 170 has a thickness greater than about 100 nm, the first porous layer 170 might not have enough surface roughness. On the other hand, when, for example, the second porous layer 172 is disposed on the first porous layer 170, the second porous layer 172 may have enough pores and surface roughness and the sum of thicknesses of the first porous layer 170 and the second porous layer 172 may be above about 100 nm. Therefore, a total thickness of the first porous layer 170 and the second porous layer 172 may increase, and a total capacity for receiving the residual moisture and the residual solvent may also increase.

The first planarization layer 180 may be disposed on the second porous layer 172. The first planarization layer 180 may have a substantially flat top surface. For example, the first planarization layer 180 may include various resins such as an acryl resin, a liquid silicon, or a silicon filler.

After forming the encapsulation structure, the residual moisture or the residual solvent may be distributed in the first porous layer 170 and the second porous layer 172. The residual moisture or the residual solvent may be received in the plurality of pores of the first porous layer 170 and the second porous layer 172. Therefore, the residual moisture or the residual solvent may be prevented from contaminating or degrading the organic light emitting structure, such that a dark spot or a pixel shrinkage may be prevented.

The first barrier layer 190 may be disposed on the first planarization layer 180. The first barrier layer 190 may encapsulate the organic light emitting structure between the substrate 100 and the first barrier layer 190. The first barrier layer 190 may include a low melting point glass that is substantially the same as those illustrated in FIG. 1. Further, the first planarization layer 180 may have the flat top surface, such that the first barrier layer 190 coated on the first planarization layer 180 may be formed stably.

According to example embodiments, the encapsulation structure may include the first porous layer 170, the second porous layer 172, the first planarization layer 180, and the first barrier layer 190. The first porous layer 170 and the second porous layer 172 may receive the residual moisture or the residual solvent from the first planarization layer 180. Therefore, the residual moisture or the residual solvent need not be concentrated at a specific point, such that the dark spot or the pixel shrinkage may be prevented.

Figure 3:
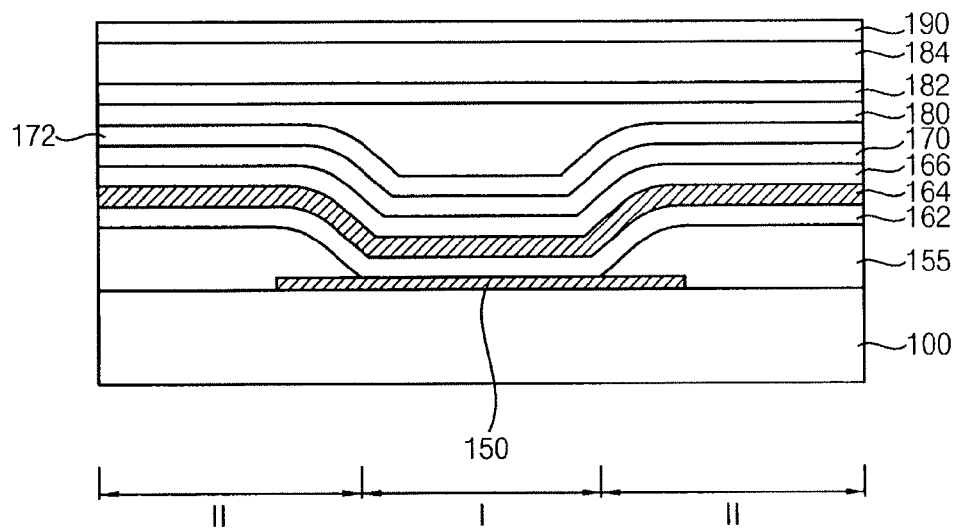
FIG. 3 illustrates a cross-sectional view of an organic light emitting structure and an encapsulation structure in accordance with other embodiments.

FIG. 3 illustrates a cross-sectional view of an organic light emitting structure and an encapsulation structure in accordance with other embodiments. Referring to FIG. 3, the organic light emitting structure may include a first electrode 150, a pixel defining layer 155, an organic layer 162 and a second electrode 164 on a substrate 100, and the encapsulation structure may include a capping layer 166, a first porous layer 170, a first planarization layer 180, a second barrier layer 182, a second planarization layer 184, and a first barrier layer 190. The substrate 100 may include a glass substrate, a quartz substrate, a transparent resin substrate, or the like. In other implementations, the substrate 100 may include a flexible substrate. The organic light emitting structure may include the first electrode 150, the pixel defining layer 155, the organic layer 162 and the second electrode 164 that may be substantially the same as or similar to those illustrated in FIG. 1.

A stepped portion is formed due to a height difference between the first electrode 150 and the pixel defining layer 155. Further, each of the organic layer 162 and the second electrode 164 may have a uniform thickness, such that the second electrode 164 may have a curved top surface. The capping layer 166 may be disposed on the second electrode 164. In example embodiments, the capping layer 166 may include silicon nitride, silicon oxynitride, or Alq3 that may have a refractive index above about 1.75. The first porous layer 170 may be disposed on the capping layer 166. The first porous layer 170 may include a plurality of pores, and may have a relatively large surface roughness. The first porous layer 170 may include lithium fluoride ($LiF_x$) or tungsten oxide ($WO_x$).

The first planarization layer 180 may be disposed on the first porous layer 170. The first planarization layer 180 may have a substantially flat top surface. The first planarization layer 180 may include various resins such as an acryl resin, a liquid silicon, or a silicon filler. The second barrier layer 182 may be disposed on the first planarization layer 180. The second barrier layer 182 may include silicon nitride, aluminum oxide ($Al_2O_3$), or a low melting point glass. The low melting point glass may be substantially the same as or similar to the low melting point glass described with reference to FIG. 1.

The second barrier layer 182 may encapsulate the organic light emitting structure between the substrate 100 and the second barrier layer 182. The second barrier layer 182 may prevent external moisture or external contaminants from infiltrating into the organic light emitting structure. The second planarization layer 184 may be disposed on the second barrier layer 182. The second planarization layer 184 may provide a flat top surface for forming the first barrier layer 190. Further, the second planarization layer 184 may absorb an external impact between the first barrier layer 190 and the second barrier layer 182.

The first barrier layer 190 may be disposed on the second planarization layer 184. The first barrier layer 190 may encapsulate the organic light emitting structure between the substrate 100 and the first barrier layer 190. The first barrier layer 190 may prevent external moisture or external contaminants from infiltrating into the organic light emitting structure. The first barrier layer 190 may include a low melting point glass that is substantially the same as those illustrated in FIG. 1.

According to present disclosure, the encapsulation structure may include the first porous layer 170, the first planarization layer 180, the second barrier layer 182, the second planarization layer 184, and the first barrier layer 190. The first porous layer 170 may receive the residual moisture or the residual solvent from the first planarization layer 180. The residual moisture or the residual solvent need not be concentrated at a specific point, such that the dark spot or the pixel shrinkage may be prevented. Further, the first barrier layer 190 and the second barrier layer 182 may effectively encapsulate the organic light emitting structure. The first planarization layer 180 and the second planarization layer 184 may provide flat top surfaces and may absorb the external impact.

Figure 4:
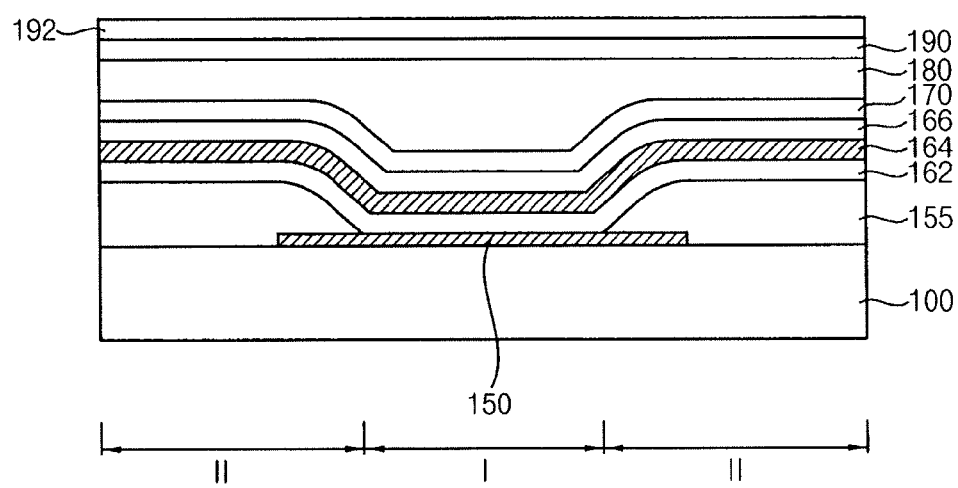
FIG. 4 illustrates a cross-sectional view of an organic light emitting structure and an encapsulation structure in accordance with other embodiments.

FIG. 4 illustrates a cross-sectional view of an organic light emitting structure and an encapsulation structure in accordance with other embodiments. Referring to FIG. 4, the organic light emitting structure may include a first electrode 150, a pixel defining layer 155, an organic layer 162, and a second electrode 164 on a substrate 100, and the encapsulation structure may include a capping layer 166, a first porous layer 170, a first planarization layer 180, a first barrier layer 190, and a second barrier layer 192. The substrate 100 may include a glass substrate, a quartz substrate, a transparent resin substrate, or the like. In other implementations, the substrate 100 may include a flexible substrate. The organic light emitting structure may be disposed on the substrate 100. The first electrode 150, the pixel defining layer 155, the organic layer 162, and the second electrode 164 of FIG. 4 may be substantially the same as or similar to those illustrated in FIG. 1. The encapsulation structure may be substantially the same as or similar to that illustrated in FIG. 1 except for further including the second barrier layer 192.

The first barrier layer 190 may be disposed in the first planarization layer 180. The first barrier layer 190 may include a first low melting point glass. For example, the first low melting point glass may include a tin-phosphate glass, a tin-fluorophosphate glass, or a tin-borophosphate glass. The first low melting point glass may include tin oxide (SnO). Particularly, the first low melting point glass may include tin ions ($Sn^{2+}$).

The second barrier layer 192 may include a second low melting point glass that may include a tin-phosphate glass, a tin-fluorophosphate glass, or a tin-borophosphate glass. The second barrier layer 192 may be formed by oxidizing the first barrier layer 190. Tin oxide (SnO) of the first low melting point glass may be further oxidized into tin dioxide ($SnO_2$) (that is, tin ions ($Sn^{2+}$) is further oxidized into oxidized tin ions ($Sn^{4+}$)), thereby forming the second barrier layer 192 at a top surface of the first barrier layer 190. The second barrier layer 192 may have a density substantially higher than that of the first barrier layer 190, and defects of the first barrier layer 190 may be covered by the second barrier layer 192. Accordingly, the second barrier layer 192 may include oxidized tin ion ($Sn^{4+}$). The first barrier layer 190 and the second barrier layer 192 may effectively encapsulate the organic light emitting structure.

Figure 5:
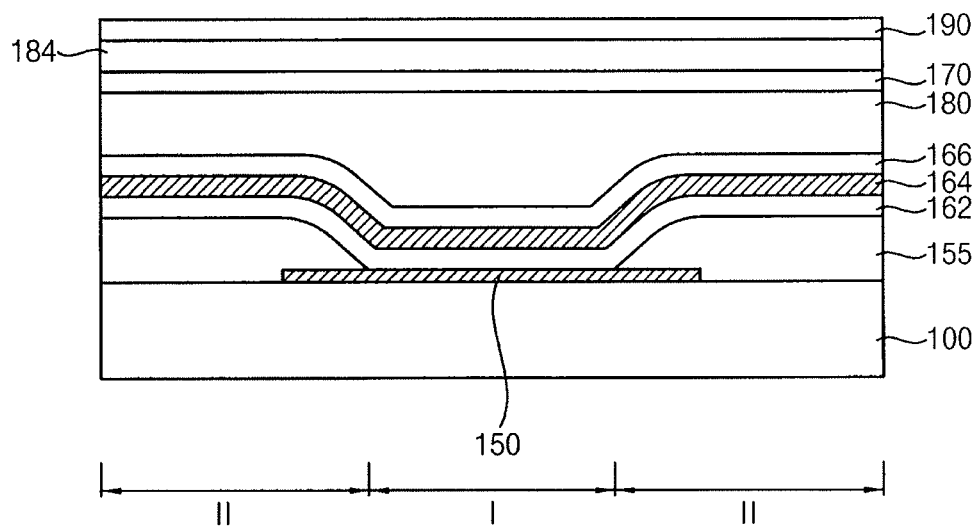
FIG. 5 illustrates a cross-sectional view of an organic light emitting structure and an encapsulation structure in accordance with other embodiments.

FIG. 5 illustrates a cross-sectional view of an organic light emitting structure and an encapsulation structure in accordance with other embodiments. Referring to FIG. 5, the organic light emitting structure may include a first electrode 150, a pixel defining layer 155, an organic layer 162 and a second electrode 164 on a substrate 100, and the encapsulation structure may include a capping layer 166, a first porous layer 170, a first planarization layer 180, a second planarization layer 184, and a first barrier layer 190. The substrate 100 may include a glass substrate, a quartz substrate, a transparent resin substrate, or the like. In other implementations, the substrate 100 may include a flexible substrate. The organic light emitting structure may be disposed on the substrate 100. The first electrode 150, the pixel defining layer 155, the organic layer 162, and the second electrode 164 of FIG. 5 may be substantially the same as or similar to those illustrated in FIG. 1. The encapsulation structure may be substantially the same as or similar to those illustrated in FIG. 1 except for further including the second planarization layer 184 and except for a position of the first porous layer 170.

The first planarization layer 180 may be on the capping layer 166. The first planarization layer 180 may include various organic materials, and may have a flat top surface. The second planarization layer 184 may be above the first planarization layer 180. The second planarization layer 184 may include material substantially the same as that of the first planarization layer 180. The second planarization layer 184 may also include a flat top surface.

The first porous layer 170 may be disposed between the first planarization layer 180 and the second planarization layer 184. The first porous layer 170 may include a plurality of pores, and may have a relatively large surface roughness. In example embodiments, the first porous layer 170 may include lithium fluoride ($LiF_x$) or tungsten oxide ($WO_x$). The first porous layer 170 may receive a residual moisture or a residual solvent from the first planarization layer 180 and the second planarization layer 184. The first barrier layer 190 may be disposed on the first planarization layer 180. The first barrier layer 190 may encapsulate the organic light emitting structure between the substrate 100 and the first barrier layer 190.

According to present disclosure, the encapsulation structure may include the first porous layer 170, the first planarization layer 180, the second planarization layer 184, and the first barrier layer 190. The first porous layer 170 may receive the residual moisture or the residual solvent from the first and second planarization layers 180 and 184. Therefore, the residual moisture or the residual solvent need not be concentrated at a specific point, such that the dark spot or the pixel shrinkage may be prevented.

Figure 6:
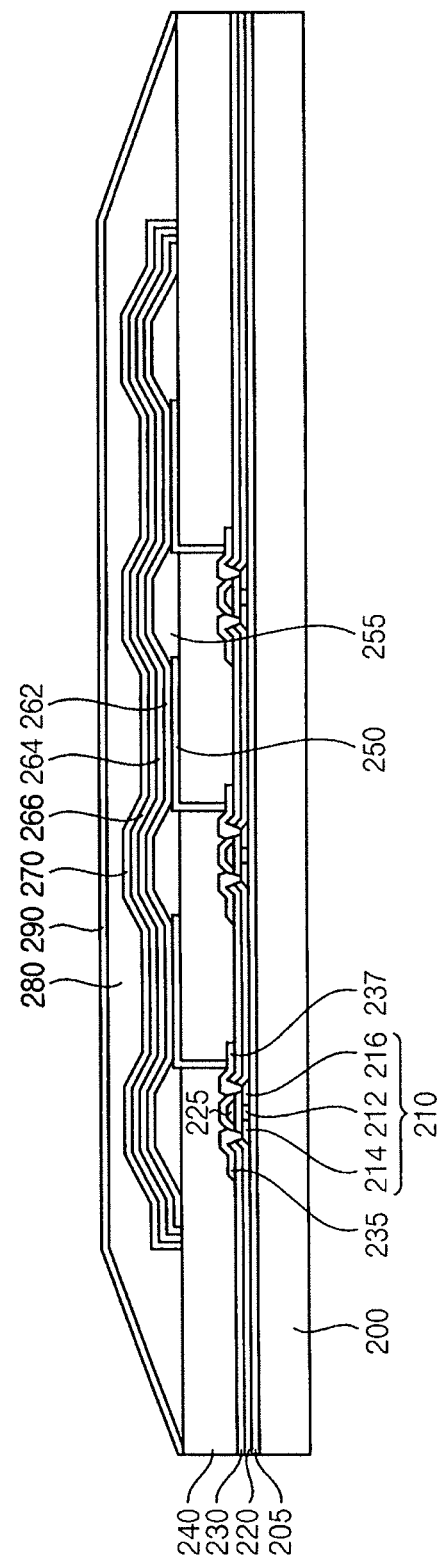
FIG. 6 illustrates a cross-sectional view of an organic light emitting display device in accordance with some embodiments.

FIG. 6 illustrates a cross-sectional view of an organic light emitting display device in accordance with some embodiments. Referring to FIG. 6, the organic light emitting display device may include a switching structure, an organic light emitting structure, and an encapsulation structure disposed on a substrate 200. The substrate 200 may include a transparent insulating substrate. For example, the substrate 200 may include a glass substrate, a quartz substrate, a transparent resin substrate, or the like. In other implementations, the substrate 200 may include a flexible substrate. A buffer layer 205 may be disposed on the substrate 200. The buffer layer 205 may prevent a diffusion of impurities from the substrate 200. The buffer layer 205 may also improve a flatness of the substrate 200.

When, for example, the display device is an active matrix type, the switching structure may be disposed between the substrate 200 and the first electrode 250. In example embodiments, the switching device may include a thin film transistor having a semiconductor pattern containing silicon. In other example embodiments, the switching device may include an oxide semiconductor device having a semiconductor pattern containing a metal oxide semiconductor. For example, the switching structure may include a semiconductor pattern 210, a gate electrode 225, a source electrode 235, and a drain electrode 237. The semiconductor pattern 210 may be disposed on the buffer layer 205, and a gate insulation layer 220 may be disposed on the buffer layer 205 to cover the semiconductor pattern 210. The semiconductor pattern 210 may be divided into a source region 214, a drain region 216, and a channel region 212.

The semiconductor pattern 210 may include polysilicon, doped polysilicon, amorphous silicon, doped amorphous silicon, or the like. These may be used alone or in a combination thereof. In other example embodiments, the semiconductor pattern 210 may include aluminum zinc oxide (AlZnO), aluminum zinc tin oxide (AlZnSnO), gallium zinc tin oxide (GaZnSnO), indium gallium oxide (InGaO), indium gallium zinc oxide (InGaZnO), indium tin zinc oxide (InSnZnO), indium zinc oxide (InZnO), hafnium indium zinc oxide (HfInZnO), or zirconium tin oxide (ZnSnO). Further, the gate insulation layer 220 may include an insulation material such as silicon oxide or silicon nitride.

The gate electrode 225 may be disposed on the gate insulation layer 220 adjacent to the semiconductor pattern 210. For example, the gate electrode 225 may overlap with the channel region 212 of the semiconductor pattern 210. The gate electrode 225 may include a metal, a conductive metal nitride, a conductive metal oxide, or a transparent conductive material. A first insulating interlayer 230 may be disposed on the gate insulation layer 220 to cover the gate electrode 225. The first insulating interlayer 230 may include an insulation material such as silicon oxide or silicon nitride. The source electrode 235 and the drain electrode 237 may be disposed through the first insulting interlayer 230 and the gate insulation layer 220, thereby contacting the source region 214 and the drain region 216, respectively. The source electrode 235 and the drain electrode 237 may include a metal, a conductive metal nitride, a conductive metal oxide, or a transparent conductive material.

The switching structure of FIG. 6 may, for example, include a thin film transistor having a top gate structure, in which the gate electrode 225 may, for example, be disposed above the semiconductor pattern 210. The switching structure may include a thin film transistor having a bottom gate structure, in which a semiconductor pattern may be disposed above a gate electrode. Further, a second insulating interlayer 240 may be disposed on the first insulating interlayer 230 to cover the source electrode 235 and the drain electrode 237.

Referring now to FIG. 6, the organic light emitting structure may be disposed on the second insulating interlayer 240 covering the switching structure. The organic light emitting structure may include the first electrode 250, a pixel defining layer 255, an organic layer 262 and a second electrode 264. The first electrode 250 may be disposed on the second insulating interlayer 240. The first electrode 250 may be disposed through the second insulating interlayer 240, thereby contacting the drain electrode 237 of the switching structure. Therefore, the first electrode 250 may be electrically connected to the switching structure. For example, the first electrode 250 may serve as a pixel electrode that may be patterned to correspond to each pixel. Further, the first electrode 250 may be an anode for supplying holes into the organic layer 262.

When, for example, the organic light emitting structure has a top emission type, the first electrode 250 may serve as a reflective electrode having a reflectivity. The first electrode 250 may include a metal and/or an alloy having a relatively high reflectivity. For example, the first electrode 250 may include silver (Ag), aluminum (Al), platinum (Pt), gold (Au), chromium (Cr), tungsten (W), molybdenum (Mo), titanium (Ti), palladium (Pa), an alloy thereof, or the like, or any combination thereof. These may be used alone or in a combination thereof.

The pixel defining layer 255 may be disposed on the second insulating interlayer 240. The pixel defining layer 255 may cover a portion of the first electrode 250. Therefore, the pixel defining layer 255 may separate each of the first electrodes 250, and may prevent a concentration of a current at an end portion (that is, an edge) of the first electrode 250. The pixel defining layer 255 may have a top surface substantially higher than a top surface of the first electrode 250. The pixel defining layer 255 may have a sidewall that may have an acute angle with respect to the top surface of the first electrode 250. Therefore, a stepped portion may be formed due to a height difference between the first electrode 250 and the pixel defining layer 255.

The organic layer 262 may include at least one of light emitting layer. In example embodiments, the organic layer 262 may include a blue light emitting layer, a green light emitting layer, and a red light emitting layer that may be sequentially stacked to emit a white light. Further, the organic layer 262 may be disposed on the top surface of the first electrode 250, and the top surface and the sidewall of the pixel defining layer 255 as illustrated in FIG. 6. The organic layer 262 may selectively include a hole transfer layer, a hole injection layer, an electron injection layer, or an electrode transfer layer. In example embodiments, the organic layer 262 may have a substantially uniform thickness. The top surface of the first electrode 250 and the top surface and the sidewall of the pixel defining layer 255 may form a curved surface, such that the organic layer 262 may have a curved top surface according to profiles of the first electrode 250 and the pixel defining layer 255.

The second electrode 264 may be disposed on the organic layer 262. When, for example, the first electrode 250 serves as the pixel electrode, the second electrode 264 may serve as a common electrode that may entirely cover the organic layer 262. Further, when, for example, the first electrode 250 is the anode, the second electrode 264 may be a cathode for supplying electrons into the organic layer 262.

When, for example, the organic light emitting structure has the top emission type, the second electrode 264 may serve as a transparent electrode or a transflective electrode. For example, the second electrode 264 may include silver (Ag), aluminum (Al), platinum (Pt), gold (Au), chromium (Cr), tungsten (W), molybdenum (Mo), titanium (Ti), palladium (Pa), alloys of these metals, and/or indium tin oxide (ITO). If the second electrode 264 has a relatively large thickness, a light efficiency of the organic light emitting structure may degrade, such that the second electrode 264 may have a relatively small thickness. For example, the second electrode 264 may have a thickness below about 20 nm. Particularly, the second electrode 264 may have a thickness of about 10 nm to about 17 nm.

Referring now to FIG. 6, the encapsulation structure may be disposed on the organic light emitting structure. For example, the encapsulation structure may include a capping layer 266, a first porous layer 270, a first planarization layer 280, and a first barrier layer 290. The capping layer 266 may be disposed on the second electrode 264. The capping layer 266 may include a transparent material having a refractive index above about 1.75. For example, the capping layer 266 may include silicon nitride, silicon oxynitride, or Alq3 (tris (8-oxoquinoline)aluminum(III)).

As the refractive index of the capping layer 266 increases, the light emitted from the organic layer 262 may travel in a direction substantially perpendicular to a top surface of the substrate 200. The refractive index of the capping layer 266 increases, the light passing through the capping layer 266 may be refracted in the direction substantially perpendicular to the top surface of the substrate 200 according to Snell's law. For example, the capping layer 266 may include an insulation material for isolating the second electrode 264.

The first porous layer 270 may be disposed on the capping layer 266. The first porous layer 270 may include a plurality of pores, and may have a relatively large surface roughness. In example embodiments, the first porous layer 270 may include lithium fluoride ($LiF_x$) or tungsten oxide ($WO_x$). The first porous layer 270 may have a thickness of about 50 nm to about 100 nm. As the thickness of the first porous layer 270 increases above about 100 nm, a density of the first porous layer 270 may increase, and the number of pores and the surface roughness of the first porous layer 270 may decrease. When the first porous layer 270 has a thickness above about 100 nm, for example, the first porous layer 270 might not have enough surface roughness. Further, when the first porous layer 270 has a thickness below about 50 nm, for example, the first porous layer 270 might not include enough pores for receiving a residual moisture or a residual solvent from the first planarization layer 280 that will be described as follow.

The first planarization layer 280 may be disposed on the first porous layer 270. The first planarization layer 280 may include various organic materials. For example, the first planarization layer 280 may include various resins such as an acryl resin, a liquid silicon or a silicon filler. The first planarization layer 280 may have a substantially flat top surface. For example, the first planarization layer 280 may have the flat top surface in a region where the organic light emitting structure is disposed, and the first planarization layer 280 may have an inclined top surface in an edge region of the substrate 200. For example, an angle of the inclined top surface may be below about 10 degrees. The first planarization layer 280 may have the top surface without a stepped portion.

In the present disclosure, the first planarization layer 280 may be formed by preparing a coating solution using the acryl resin and a solvent, by coating on the first planarization layer 270 using the coating solution, and by performing a thermal hardening process or a ultra-violet (UV) hardening process. Then, a heat treatment process or an outgassing process may be performed to remove moisture or a solvent in the first planarization layer 280. Even though, the heat treatment process or the outgassing process may be performed for a relatively long time, a moisture or a solvent may inevitably remain in the first planarization layer 280.

After forming the encapsulation structure, the residual moisture or the residual solvent may be distributed in the first porous layer 270. The residual moisture or the residual solvent may be received in the plurality of pores of the first porous layer 270, and in an interface between the top surface of the first porous layer 270 and the bottom surface of the first planarization layer 280. Therefore, the residual moisture or the residual solvent need not contaminate or degrade the organic light emitting structure, such that a dark spot or a pixel shrinkage may be prevented. Further, when, for example, the first porous layer 270 includes lithium fluoride, the lithium fluoride may effectively absorb the residual moisture. The lithium fluoride of the first porous layer 270 may react with the residual moisture, such that the first porous layer 270 may have an improved moisture absorption characteristic.

The first barrier layer 290 may be disposed on the first planarization layer 280. The first barrier layer 290 may encapsulate the organic light emitting structure between the substrate 200 and the first barrier layer 290. The first barrier layer 290 may prevent external moisture or external contaminants from infiltrating into the organic light emitting structure, thereby degrading the organic light emitting structure. The first barrier layer 290 may include a low melting point glass. For example, the low melting point glass may include a tin-phosphate glass, a tin-borophosphate glass, a tin-fluorophosphate glass, a tungsten-doped tin-fluorophosphate glass, a chalcogenide glass, a telluride glass, a borate glass, or a phosphate glass.

The low melting point glass may include the tin-phosphate glass. The tin phosphate glass may be formed by mixing tin oxide (SnO) and phosphorus oxide ($P_2O_5$). For example, the tin phosphate glass may include about 5 to 90 mol % $P_2O_5$ and about 10 to 95 mol % SnO. The tin phosphate glass may include tin ions ($Sn^{2+}$). The low melting point glass may include the tin-fluorophosphate glass. The tin-fluorophosphate glass may be formed by mixing tin fluoride ($SnF_2$), tin oxide (SnO), and phosphorus oxide ($P_2O_5$). For example, the tin-fluorophosphate glass may include tin ions ($Sn^{2+}$). The low melting point glass may include the tin-borophosphate glass. The tin-borophosphate glass may be formed by mixing tin oxide (SnO) and boron phosphate ($BPO_4$). For example, the tin-borophosphate glass may include tin ions ($Sn^{2+}$). The low melting point glass may have a melting point below about 1000° C., particularly a melting point below about 600° C., more particularly a melting point below about 400° C.

The first barrier layer 290 may be formed by a process for forming a layer and a process for removing defects of the layer. The process for removing the defects may include a heat treatment process. The first barrier layer 290 may have an improved encapsulation characteristic by the heat treatment process. The heat treatment process may be performed at a temperature between about 100° C. and about 150° C. The first barrier layer 290 may have a relatively low melting point, such that the heat treatment process may partially sinter the first barrier layer 290 thereby removing the defects of the first barrier layer 290. The temperature of the heat treatment process may be relatively low, such that the heat treatment process need not damage the organic light emitting structure or the substrate 200.

Further, the first planarization layer 280 may have the flat top surface, such that the first barrier layer 290 coated on the first planarization layer 280 may be formed stably. The first barrier layer 290 on the first planarization layer 280 may have a uniform thickness and a relatively high density. The first planarization layer 280 may cover inevitable particles or contaminants that may be created during the manufacturing process, such that the first barrier layer 290 need not have defects resulting from the inevitable particles or contaminants. The first barrier layer 290 disposed on the first planarization layer 280 may have an improved reliability.

A color filter may be further disposed on or under the encapsulation layer structure. According to the present disclosure, the encapsulation structure may include the first porous layer 270, the first planarization layer 280, and the first barrier layer 290. The first planarization layer 280 may have the flat top surface, such that the first barrier layer 290 disposed on the first planarization layer 280 may have the uniform thickness and the relatively high density, thereby having the improved encapsulation characteristic. The first porous layer 270 may receive the residual moisture or the residual solvent from the first planarization layer 280. The residual moisture or the residual solvent need not be concentrated at a specific point, such that the dark spot or the pixel shrinkage may be prevented. Further, the first barrier layer 290 may include the low melting point glass, such that the low temperature heat treatment process may remove the defects of the first barrier layer 290. Accordingly, the first barrier layer 290 may have the improved reliability.

Figure 7:
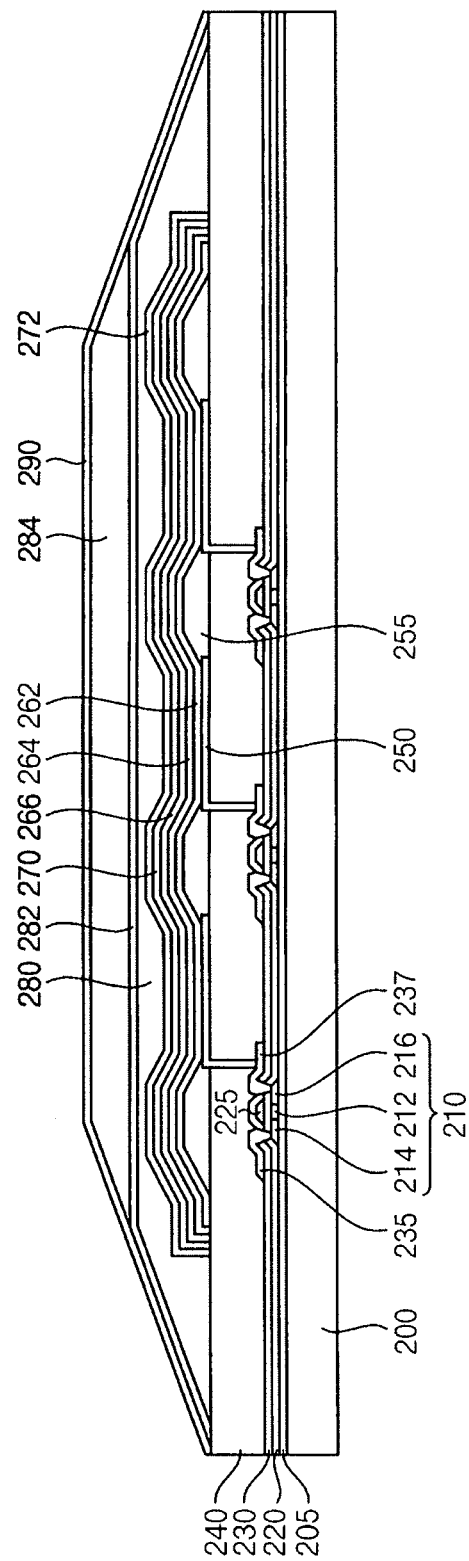
FIG. 7 illustrates a cross-sectional view of an organic light emitting display device in accordance with other embodiments.

FIG. 7 illustrates a cross-sectional view of an organic light emitting display device in accordance with other embodiments. Referring to FIG. 7, the organic light emitting display device may include a switching structure, an organic light emitting structure and an encapsulation structure disposed on a substrate 200. The organic light emitting display device may be substantially the same as or similar to those illustrated in FIG. 6 except for the encapsulation structure. When, for example, the display device has an active matrix type, the switching structure may be disposed between the substrate 200 and the first electrode 250. The switching structure may include a semiconductor pattern 210, a gate insulation layer 220, a gate electrode 225, a source electrode 235, and a drain electrode 237.

The organic light emitting structure may be disposed on the second insulating interlayer 240 covering the switching structure. In example embodiments, the organic light emitting structure may include the first electrode 250, a pixel defining layer 255, an organic layer 262, and a second electrode 264. The encapsulation structure may be disposed on the organic light emitting structure. The encapsulation structure may include a capping layer 266, a first porous layer 270, a second porous layer 272, a first planarization layer 280, a second barrier layer 282, a second planarization layer 284, and a first barrier layer 290. The first porous layer 270 may be disposed on the capping layer 266. The first porous layer 270 may include a plurality of pores, and may have a relatively large surface roughness. In example embodiments, the first porous layer 270 may include lithium fluoride ($LiF_x$) or tungsten oxide ($WO_x$).

The second porous layer 272 may be disposed on the first porous layer 270. The second porous layer 272 may include a plurality of pores, and may have a relatively large surface roughness. The second porous layer 272 may include a material different from that of the first porous layer 270. The second porous layer 272 may include, for example, aluminum oxide ($Al_2O_3$) or tungsten oxide ($WO_x$), when the first porous layer 270 includes lithium fluoride ($LiF_x$). The second porous layer 272 may include, for example, aluminum oxide ($Al_2O_3$) or lithium fluoride ($LiF_x$), when the first porous layer 270 includes tungsten oxide ($WO_x$). The second porous layer 272 may be formed by a sputtering process using aluminum oxide ($Al_2O_3$). A top surface of the first porous layer 270 may include the plurality of pores and have the relatively large surface roughness, such that the aluminum oxide formed on the top surface of the first porous layer 270 may also include the plurality of pores. The second porous layer 272 may have a thickness of about 50 nm to about 100 nm.

As described with reference to FIG. 1, when, for example, the first porous layer 270 has a thickness above about 100 nm, the first porous layer 270 might not have enough surface roughness. On the other hand, when, for example, the second porous layer 272 is disposed on the first porous layer 270, the second porous layer 272 may have enough pores and surface roughness and the sum of thicknesses of the first porous layer 270 and the second porous layer 272 may be above about 100 nm. Therefore, a total thickness of the first porous layer 270 and the second porous layer 272 may increase, and a total capacity for receiving the residual moisture and the residual solvent may increase.

The first planarization layer 280 may be disposed on the second porous layer 272. The first planarization layer 280 may have a substantially flat top surface. The first planarization layer 280 may include various resins such as an acryl resin, a liquid silicon, or a silicon filler. After forming the encapsulation structure, the residual moisture or the residual solvent may be distributed in the first porous layer 270 and the second porous layer 272. The residual moisture or the residual solvent may be received in the plurality of pores of the first porous layer 270 and the second porous layer 272. Therefore, the residual moisture or the residual solvent need not contaminate or degrade the organic light emitting structure, such that a dark spot or a pixel shrinkage may be prevented.

The second barrier layer 282 may be disposed on the first planarization layer 280. The second barrier layer 282 may include silicon nitride, aluminum oxide ($Al_2O_3$), or a low melting point glass. The low melting point glass may be substantially the same as or similar to the low melting point glass described with reference to FIG. 1. The second barrier layer 282 may encapsulate the organic light emitting structure between the substrate 200 and the second barrier layer 282. The second planarization layer 284 may be disposed on the second barrier layer 282. The second planarization layer 284 may provide a flat top surface for forming the first barrier layer 290.

The first barrier layer 290 may be disposed on the second planarization layer 284. The first barrier layer 290 may encapsulate the organic light emitting structure between the substrate 200 and the first barrier layer 290. The first barrier layer 290 may prevent external moisture or external contaminants from infiltrating into the organic light emitting structure.

According to the present disclosure, the encapsulation structure may include the first porous layer 270, the second porous layer 272, the first planarization layer 280, the second barrier layer 282, the second planarization layer 284, and the first barrier layer 290. The first porous layer 270 and the second porous layer 272 may receive the residual moisture or the residual solvent from the first planarization layer 280. Therefore, the residual moisture or the residual solvent need not be concentrated at a specific point, such that the dark spot or the pixel shrinkage may be prevented.

Figure 8:
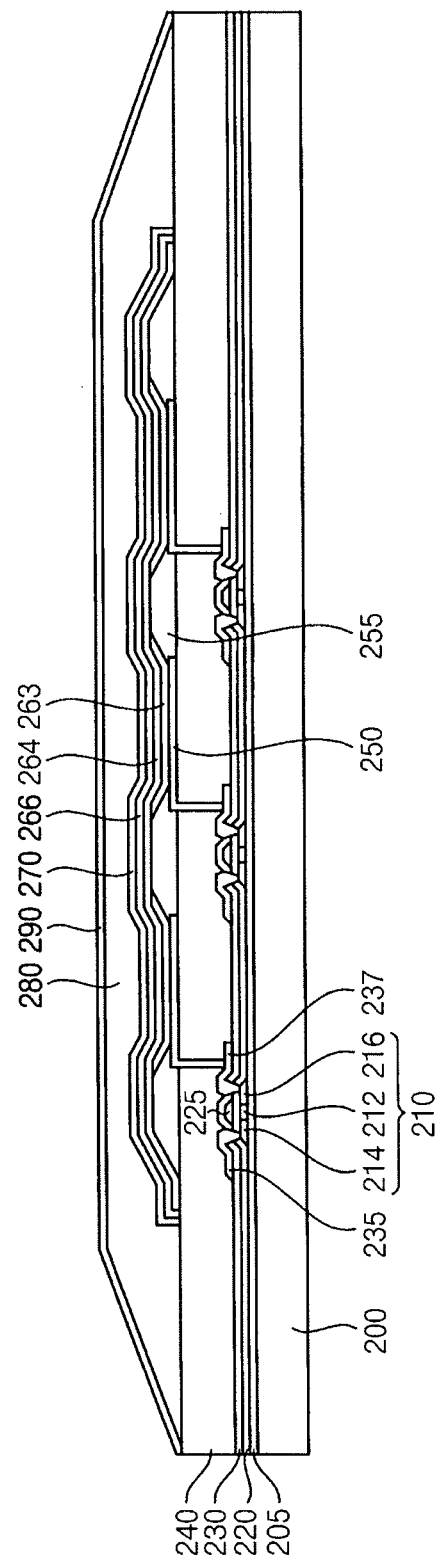
FIG. 8 illustrates a cross-sectional view of an organic light emitting display device in accordance with other embodiments.

FIG. 8 illustrates a cross-sectional view of an organic light emitting display device in accordance with other embodiments. Referring to FIG. 8, the organic light emitting display device may include a switching structure, an organic light emitting structure and an encapsulation structure disposed on a substrate 200. The organic light emitting structure may include a first electrode 250, a pixel defining layer 255, an organic layer 263, and a second electrode 264. The organic layer 263 may be disposed on a top surface of the first electrode 250 and a sidewall of the pixel defining layer 255, which may be different from the organic layer 262 illustrated in FIG. 6. Therefore, the organic layer 263 may be separated into each pixel.

The encapsulation structure may be disposed on the organic light emitting structure. The encapsulation structure may include a capping layer 266, a first porous layer 270, a first planarization layer 280, and a first barrier layer 290. The first porous layer 270 may be disposed on the capping layer 266. The first porous layer 270 may include a plurality of pores, and may have a relatively large surface roughness. In example embodiments, the first porous layer 270 may include lithium fluoride ($LiF_x$) or tungsten oxide ($WO_x$). The first planarization layer 280 may be disposed on the second porous layer 272. The first planarization layer 280 may have a substantially flat top surface. The first planarization layer 280 may include various resins such as an acryl resin, a liquid silicon or a silicon filler. The first barrier layer 290 may be disposed on the second planarization layer 284. The first barrier layer 290 may encapsulate the organic light emitting structure between the substrate 200 and the first barrier layer 290. The first barrier layer 290 may prevent external moisture or external contaminants from infiltrating into the organic light emitting structure.

Figure 9:
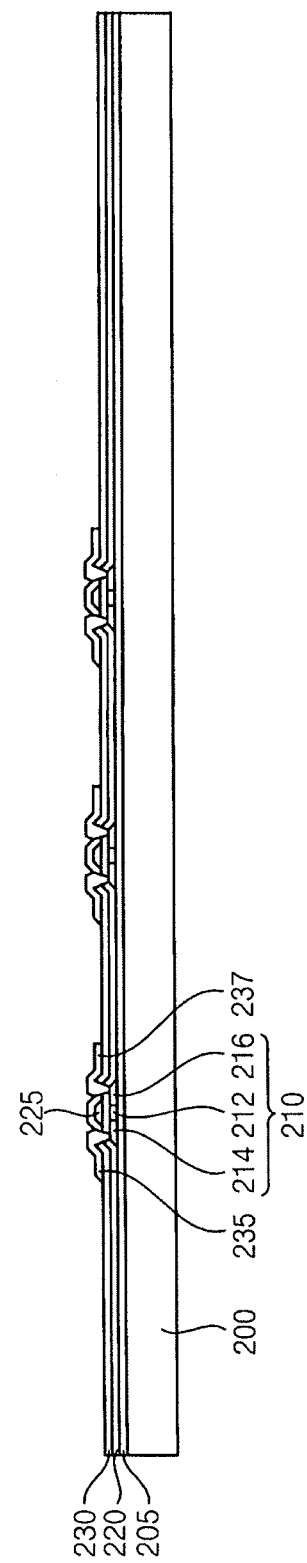
FIGS. 9 to 13 illustrate cross-sectional views depicting stages of a method of manufacturing an organic light emitting display device in accordance with some embodiments.

FIGS. 9 to 13 illustrate cross-sectional views depicting stages of a method of manufacturing an organic light emitting display device in accordance with some embodiments. Referring to FIG. 9, a switching structure may be formed on a substrate 200. After forming a buffer layer 205 on the substrate 200, the switching structure may be formed on the buffer layer 205. A semiconductor pattern 210 may be formed and impurities may be implanted into the semiconductor pattern 210, thereby forming a channel region 212, a source region 214, and a drain region 216. Then, a gate insulation layer 220 may be formed to cover the semiconductor pattern 210, and a gate electrode 225 may be formed on the gate insulation layer 220 such that the gate electrode 225 may overlap with the channel region 212. A first insulating interlayer 230 may be formed to cover the gate electrode 225, and then the gate insulation layer 220 and the first insulating interlayer 230 may be partially removed to form holes exposing the source region 214 and the drain region 215. A source electrode 235 and a drain electrode 237 may be formed to fill the holes.

Figure 10:
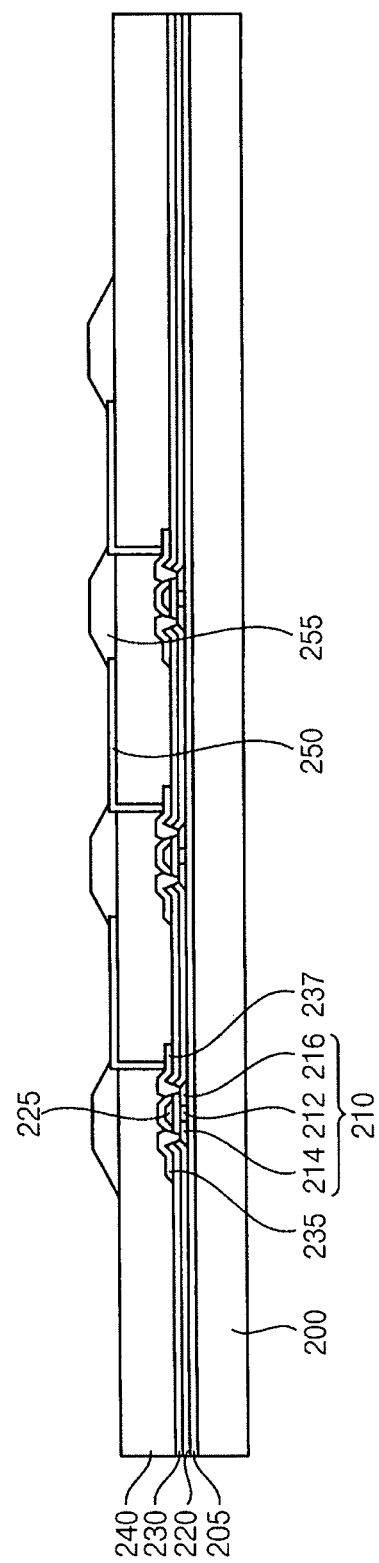

Referring to FIG. 10, a second insulating interlayer 240 may be formed to cover the switching structure, and then a first electrode 250 and a pixel defining layer 255 may be formed on the second insulating interlayer 240. The second insulating interlayer 240 may be formed using an organic insulation material such as an acryl-based resin, a polyimidebased resin, a resin including a photosensitive acryl carboxyl group, a polyamide resin, a siloxane resin, a novolac resin, an alkali-soluble resin, or the like, alone or in suitable combination, or an inorganic insulation material such as silicon oxide, silicon nitride, silicon oxynitride, silicon oxycarbide, or the like, alone or in suitable combination.

A conductive layer may be formed on the second insulation layer 240, and then the conductive layer may be patterned to form the first electrode 250. When the first electrode 250 serves as a reflective electrode, for example, the conductive layer may be formed by a sputtering process or an evaporation process using include silver (Ag), aluminum (Al), platinum (Pt), gold (Au), chromium (Cr), tungsten (W), molybdenum (Mo), titanium (Ti), palladium (Pa), an alloy thereof, or the like, or a combination thereof. When the first electrode 250 is a pixel electrode, for example, the conductive layer may be patterned to correspond to each pixel.

The pixel defining layer 255 may be formed to cover a portion of the first electrode 250. The pixel defining layer 255 may have a top surface substantially higher than a top surface of the first electrode 250. The pixel defining layer 255 may have a sidewall that may have an acute angle with respect to the top surface of the first electrode 250.

Figure 11:
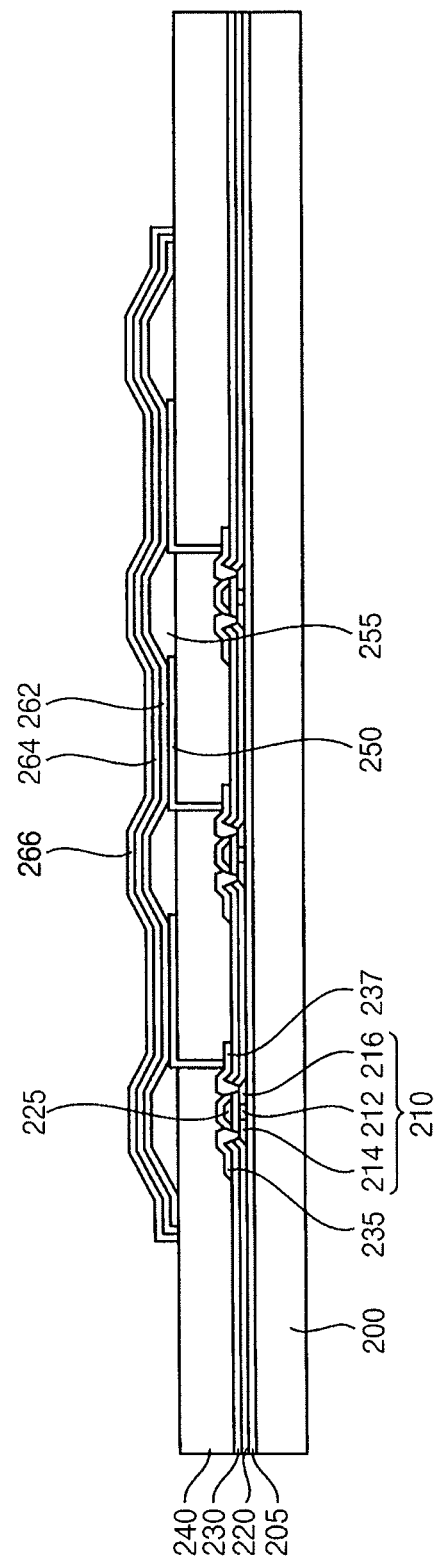

Referring to FIG. 11, an organic layer 262, a second electrode 264 and a capping layer 266 may be sequentially formed on the first electrode 250 and the pixel defining layer 255. The organic layer 262 may be formed on the first electrode 250 and the pixel defining layer 255. The organic layer 262 may include at least one of light emitting layer. In example embodiments, the organic layer 262 may be entirely formed on the first electrode 250 and the pixel defining layer 255 by a spin coating process. In other example embodiments, the organic layer 262 may be formed on the first electrode 250 to correspond to each pixel by an ink-jet printing process or a laser induced thermal imaging process.

The second electrode 264 may be formed on the organic layer 262. The second electrode 264 may be formed using a metal or an alloy such as silver (Ag), aluminum (Al), platinum (Pt), gold (Au), chromium (Cr), tungsten (W), molybdenum (Mo), titanium (Ti), palladium (Pa), and/or alloys of these metals. In other implementations, the second electrode 264 may be formed using a transparent conductive material such as indium tin oxide (ITO). When the second electrode 264 includes Mg—Ag alloy, for example, the second electrode 264 may have a thickness of about 10 nm to about 17 nm such that the second electrode 264 may have a predetermined transmittance. Then, the capping layer 266 may be conformally formed on the second electrode 264.

Figure 12:
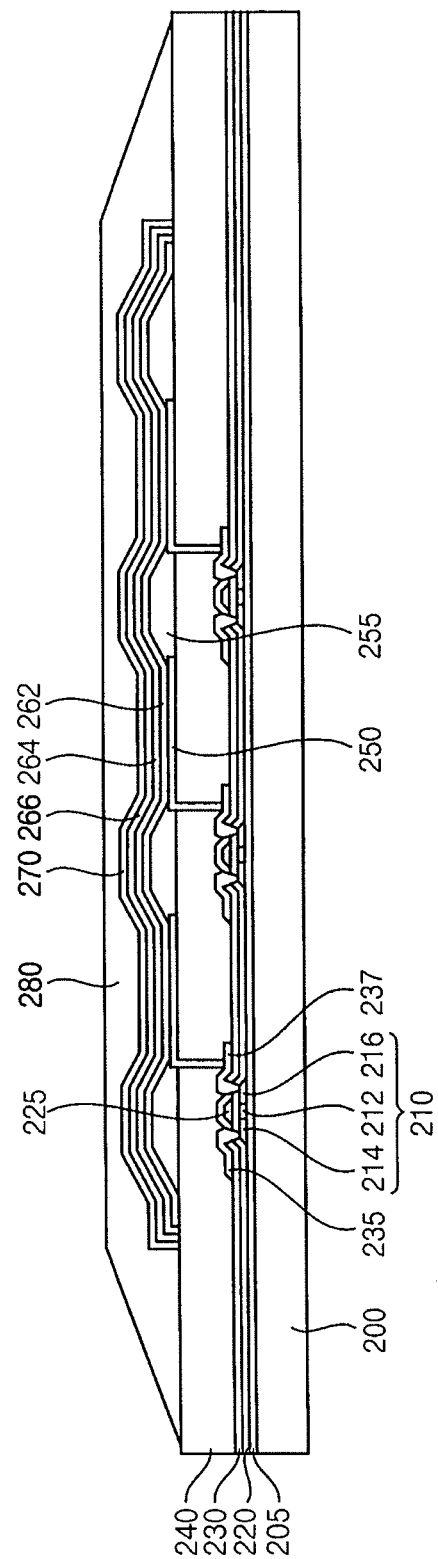

Referring to FIG. 12, a first porous layer 270 and a first planarization layer 280 may be formed on the second insulating interlayer 240 to cover the capping layer 266. For example, the first porous layer 270 may be formed by an evaporation process, a chemical vapor deposition (CVD) process or a sputtering process. The first porous layer 270 may be formed by the evaporation process. The first porous layer 270 formed by the evaporation process may include the relatively large number of pores compared with other porous layer formed by the CVD process or the sputtering process. Further, the first porous layer 270 formed by the evaporation process may have a relatively large surface roughness. When, for example, the first porous layer 270 includes lithium fluoride, the lithium fluoride may effectively absorb the residual moisture. The lithium fluoride of the first porous layer 270 may react with the residual moisture, such that the first porous layer 270 may have an improved moisture absorption characteristic. Then, the first planarization layer 280 may be formed on the second insulating interlayer 240 to cover the first porous layer 270.

The first planarization layer 280 may be formed by preparing a coating solution using various resins such as the acryl resin, a liquid silicon, or a silicon filler and a solvent, by coating on the first planarization layer 270 using the coating solution, and by performing a thermal hardening process or a ultra-violet (UV) hardening process. In this case, the first planarization layer 280 may have a substantially flat top surface. A stepped portion formed due to a height difference between the first electrode 250 and the pixel defining layer 255 may be alleviated. Then, a heat treatment process or an outgassing process may be performed to remove a moisture or a solvent in the first planarization layer 280. Even though, the heat treatment process or the outgassing process may be performed for a relatively long time, a moisture or a solvent may inevitably remain in the first planarization layer 280. When, for example, the first planarization layer 280 includes acryl resin, the first planarization layer 280 may include less residual moisture or less residual solvent compared to other case. However, the residual moisture or the residual solvent might not be completely removed from the first planarization layer 280.

Figure 13:
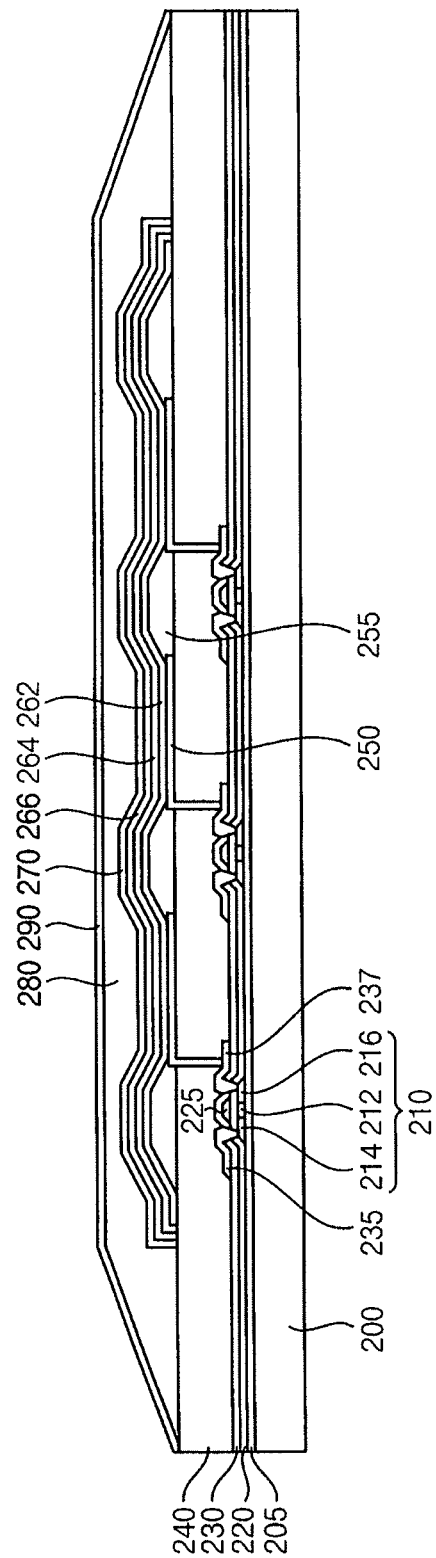

Referring to FIG. 13, a first barrier layer 290 may be formed on the second insulating interlayer 240 to cover the first planarization layer 280. The first barrier layer 290 may be formed by a sputtering process or a spin coating process using a low melting point glass. In example embodiments, the low melting point glass may include a tin-phosphate glass, a tin-borophosphate glass, a tin-fluorophosphate glass, a tungsten-doped tin-fluorophosphate glass, a chalcogenide glass, a telluride glass, a borate glass, or a phosphate glass.

The heat treatment process may be performed at a temperature between about 100° C. and about 150° C. The first barrier layer 290 may have a relatively low melting point, such that the heat treatment process may partially sinter the first barrier layer 290 thereby removing the defects of the first barrier layer 290. The temperature of the heat treatment process may be relatively low, such that the heat treatment process need not damage the organic light emitting structure or the substrate 200. Further, the first planarization layer 280 may have the flat top surface, such that the first barrier layer 290 coated on the first planarization layer 280 may be formed stably.

According to the present disclosure, the structures, devices, methods, and concepts described herein may be applied to other electric apparatuses. For example, they may be applied not only in a stationary electric apparatus such as a monitor, a television, a digital information display (DID) apparatus, but also in a portable electric apparatus such as a notebook, a digital camera, a mobile phone, a smart phone, a smart pad, a personal digital assistant (PDA), a personal media player (PMP), a MP3 player, a navigation system, a camcorder, a portable game machine, or the like.

By way of summation and review, an encapsulation structure having an improved reliability, an organic light emitting display device including the encapsulation structure, and a method of manufacturing the same are provided. The life span of an organic light emitting display device may be shorted by an infiltration of external oxygen or external moisture, which may be counteracted or prevented by use o an encapsulation structure, for example, one having an improved reliability and a relatively small thickness.

According to the present disclosure, an encapsulation structure may include a first porous layer, a first planarization layer, and a first barrier layer. The first planarization layer may have a flat top surface, such that the first barrier layer disposed on the first planarization layer may have a uniform thickness and the relatively high density, thereby having the improved encapsulation characteristic. The first porous layer may receive residual moisture or a residual solvent occurred from the first planarization layer. Therefore, the residual moisture or the residual solvent may be prevented from becoming concentrated at a specific point, such that the dark spot or the pixel shrinkage may be prevented. Further, the first barrier layer may include a low melting point glass, such that the low temperature heat treatment process may remove the defects of the first barrier layer. Accordingly, the first barrier layer may have the improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present description as set forth in the following claims.

What is claimed is:

1. An encapsulation structure for an organic light emitting display device, comprising:
   a first porous layer above a substrate, the first porous layer having a curved top surface;
   a first planarization layer on the first porous layer, the first planarization layer having a flat top surface; and
   a first barrier layer on the first planarization layer, the first barrier layer including a first low melting point glass.

2. The encapsulation structure as claimed in claim 1, wherein the first porous layer includes lithium fluoride (LiFx) or tungsten oxide (WOx).

3. The encapsulation structure as claimed in claim 1, wherein the first porous layer has a thickness of about 50 nm to about 100 nm.

4. The encapsulation structure as claimed in claim 1, wherein the first porous layer includes a plurality of pores, and the plurality of pores receives a residual moisture or a residual solvent from the first planarization layer.

5. The encapsulation structure as claimed in claim 1, wherein the first low melting point glass includes a tin-phosphate glass, a tin-borophosphate glass, a tin-fluorophosphate glass, a tungsten-doped tin-fluorophosphate glass, a chalcogenide glass, a telluride glass, a borate glass, or a phosphate glass.

6. The encapsulation structure as claimed in claim 5, wherein the first low melting point glass includes the tin-phosphate glass, the tin-borophosphate glass, or the tin-fluorophosphate glass, and wherein the first low melting point glass includes tin ions ($Sn^{2+}$).

7. The encapsulation structure as claimed in claim 6, further comprising a second barrier layer disposed on the first barrier layer,
   wherein the second barrier layer includes a second low melting point glass containing a tin-phosphate glass, a tin-borophosphate glass, or a tin-fluorophosphate glass, and wherein the second low melting point glass includes oxidized tin ions ($Sn^{4+}$).

8. The encapsulation structure as claimed in claim 1, wherein the first low melting point glass has a melting point below about 400° C.

9. The encapsulation structure as claimed in claim 1, further comprising a second porous layer between the first porous layer and the first planarization layer.

10. The encapsulation structure as claimed in claim 9, wherein the second porous layer includes aluminum oxide (AlOx), lithium fluoride (LiFx), or tungsten oxide (WOx).

11. The encapsulation structure as claimed in claim 1, further comprising:
   a second barrier layer disposed between the first planarization layer and the first barrier layer; and
   a second planarization layer disposed between the second barrier layer and the first barrier layer.

12. The encapsulation structure as claimed in claim 1, wherein the first planarization layer includes an acryl resin, a liquid silicon, or a silicon filler.

13. An organic light emitting display device, comprising:
   an organic light emitting structure on a substrate; and
   an encapsulation structure capping the organic light emitting structure,
   wherein the encapsulation structure includes:
   a first porous layer on the organic light emitting structure, the first porous layer having a curved top surface;
   a first planarization layer on the first porous layer, the first planarization layer having a flat top surface; and
   a first barrier layer on the first planarization layer, the first barrier layer including a low melting point glass.

14. The organic light emitting display device as claimed in claim 13, wherein the low melting point glass includes a tin-phosphate glass, a tin-borophosphate glass, a tin-fluorophosphate glass, a tungsten-doped tin-fluorophosphate glass, a chalcogenide glass, a telluride glass, a borate glass, or a phosphate glass.

15. The organic light emitting display device as claimed in claim 13, wherein the first porous layer includes lithium fluoride (LiFx) or tungsten oxide (WOx).

16. The organic light emitting display device as claimed in claim 13, wherein the first porous layer includes a plurality of pores, and the plurality of pores receives a residual moisture or a residual solvent from the first planarization layer.

17. The organic light emitting display device as claimed in claim 13, further comprising a second porous layer between the first porous layer and the first planarization layer.

18. The organic light emitting display device as claimed in claim 13, further comprising:
   a second barrier layer between the first planarization layer and the first barrier layer; and
   a second planarization layer between the second barrier layer and the first barrier layer.

19. A method of manufacturing an organic light emitting display device, the method comprising:
   forming an organic light emitting structure on a substrate;
   forming a porous layer covering the organic light emitting structure;
   forming a planarization layer on the porous layer, the planarization layer having a flat top surface; and
   forming a barrier layer on the planarization layer using a low melting point glass.

20. The method as claimed in claim 19, wherein forming the porous layer includes performing an evaporation process using lithium fluoride (LiFx) or tungsten oxide (WOx).

21. The method as claimed in claim 19, wherein forming the barrier layer includes performing a sputtering process or a spin coating process using the low melting point glass.

* * * * *